United States Patent [19]
Jeffries et al.

[11] Patent Number: 5,999,402
[45] Date of Patent: Dec. 7, 1999

[54] HEAT SINK FASTENER RETENTION APPARATUS AND METHOD FOR COMPUTER SYSTEMS

[75] Inventors: John Jeffries, Marble Falls; Erica Scholder, Austin; Gilberto Hernandez, Pflugerville, all of Tex.

[73] Assignee: Dell USA, L.P., Round Rock, Tex.

[21] Appl. No.: 08/959,185

[22] Filed: Oct. 28, 1997

[51] Int. Cl.⁶ .............. G06F 1/20; H05K 7/12; H05K 7/20

[52] U.S. Cl. .......... 361/687; 361/704; 361/710; 361/719; 165/80.3; 257/718; 257/719

[58] Field of Search .................. 361/687, 710, 361/704; 257/718, 719; 174/16.3; 165/80.3

[56] References Cited

U.S. PATENT DOCUMENTS

| | | |
|---|---|---|
| 4,710,852 | 12/1987 | Keen . |
| 5,331,507 | 7/1994 | Kyung et al. . |
| 5,424,913 | 6/1995 | Swindler . |
| 5,526,874 | 6/1996 | White . |
| 5,542,468 | 8/1996 | Lin .................. 361/710 |
| 5,625,227 | 4/1997 | Estes et al.. . |
| 5,662,163 | 9/1997 | Mira ................. 165/80.3 |
| 5,673,176 | 9/1997 | Penniman et al. . |
| 5,710,694 | 1/1998 | Chen ................. 361/710 |
| 5,748,446 | 5/1998 | Feightner et al. ........ 257/718 |
| 5,774,335 | 6/1998 | Pare et al. ............ 361/704 |
| 5,870,288 | 2/1999 | Chen ................. 361/704 |

OTHER PUBLICATIONS

Haynes BMW 320i Owners Workshop Manual, Chapter 9, pp. 125–128, 1984.

U.S. Application No. 08/763,238, Filed on Dec. 10, 1996, Remsburg & Scholder, *Computer System With Heat Sink Having An Integrated Grounding Tab*, Abstract and 3 sheets of drawings.

Primary Examiner—Donald Sparks
Assistant Examiner—John D. Reed
Attorney, Agent, or Firm—Haynes & Boone, L.L.P.

[57] ABSTRACT

A computer system includes a chassis and a support member mounted on the chassis. A heat sink is mounted on the support member. A resilient retainer is captively mounted on the heat sink and a fastener member is captively supported by the resilient retainer and removably secured to the support member. The retainer is a continuous strip of resilient material including fastener guide members and a fastener retention member. The fastener guide members include a first guide member aligned with a second guide member. The fastener retention member includes a slot aligned with the fastener guide members. Gripping members are provided to snap into engagement with the heat sink. The fastener member extends through the guides and the retention member and engages the support member.

20 Claims, 5 Drawing Sheets

HEAT SINK FASTENER RETENTION APPARATUS AND METHOD FOR COMPUTER SYSTEMS

BACKGROUND

The disclosures herein relate generally to heat sinks in a computer chassis and more particularly to a clip for retaining heat sink mounting fasteners used for mounting a heat sink in the chassis.

The many electrical components in a computer chassis create a lot of heat which must be removed to keep the system functioning. Many heat removal schemes are used in this environment including fans, heat sinks and combinations thereof. Heat sinks, due to their mass, must be properly supported within the chassis so as to withstand shock and vibration loads.

Heat sinks are often mounted in an abutting relationship with a thermal plate which conducts heat from a heat producing component to the heat sink. Due to the crowded confines of the computer chassis and the crowding and stacking of components therein, sufficient support is sometimes difficult to achieve. This problem is compounded by the desirability for non-threaded connectors and supports which provide for the quick attachment and release of components for the purposes of manufacturing and maintenance. Threaded connectors, such as screws, bolts, etc., have been generally undesirable due to the extended time required to attach and remove them and also due the lack of room available for the manipulation of tools needed to attach and remove such connectors.

In one example of a non-threaded connector, U.S. Pat. No. 4,710,852 discloses a spring steel bayonet type retainer for securing encapsulated semiconductor devices to circuit boards either directly or through an intermediate heat dissipator. This device includes spring fingers and bayonet arms. The retainer is installed by urging the bayonet arms through a hole in a mounting tab of the semiconductor device through the circuit board where barbs on the terminal ends of the bayonet arms lock the arms into the hole. The length of the arms is such that the body portion of the retainer is flexed to compliantly exert a force on the semiconductor device to hold it to the circuit board. This device, however, is not easily removed and is not captive to the device it secures.

In U.S. Pat. No. 5,331,507, a resilient heat sink clip has a pair of legs joined together at one end by an arcuate member. The other ends of the legs each terminate at a hook. The arcuate member bears against a heat sink while pressing it into thermal contact with an electronic device to conduct heat into the heat sink and then into the surrounding atmosphere.

In U.S. Pat. No. 5,625,227, a circuit board has an opening through which a heat sink structure passes. The heat sink is thermally coupled on one side of a die cavity lid. The other side of the heat sink structure engages a metal chassis section which engages the outer plastic wall of a computer.

In U.S. Pat. No. 5,424,913, an access door includes a heat sink having a heat receiving portion positioned to mechanically contact a surface of the component to allow transmission of heat from the component to the heat receiving portion. The heat sink further includes a heat dissipating portion forming an outer surface of the access door that is capable of dissipating heat received from the component via the heat receiving portion into an environment surrounding the computer system. The door cools the component when in the closed position and allows access to the component when in the open position.

Therefore, what is needed is a method and apparatus whereby a fastener used to mount a heat sink in a computer chassis is captive to the heat sink so as to be manually accessible and ready for installing the heat sink in the chassis.

SUMMARY

One embodiment, accordingly, provides a method and apparatus for retaining a fastener on a heat sink so that the fastener is positioned for easy access to mount the heat sink in a computer chassis. To this end, a heat sink support system includes a chassis, a support member mounted on the chassis and a heat sink mounted on the support member. A resilient retainer is removably mounted on the heat sink and a fastener member is supported by the resilient member and removably secured to the support member.

A principal advantage of this embodiment is that the fastener is retained on the heat sink by the retainer and is positioned for easy access to enable facilitated installation and removal of the heat sink. Also, the fastener is retained in a manner so that it will not be dropped on electronic components with possible resulting damage.

DETAILED DESCRIPTION OF THE PREFERRED EMBODIMENT

Figure 1:
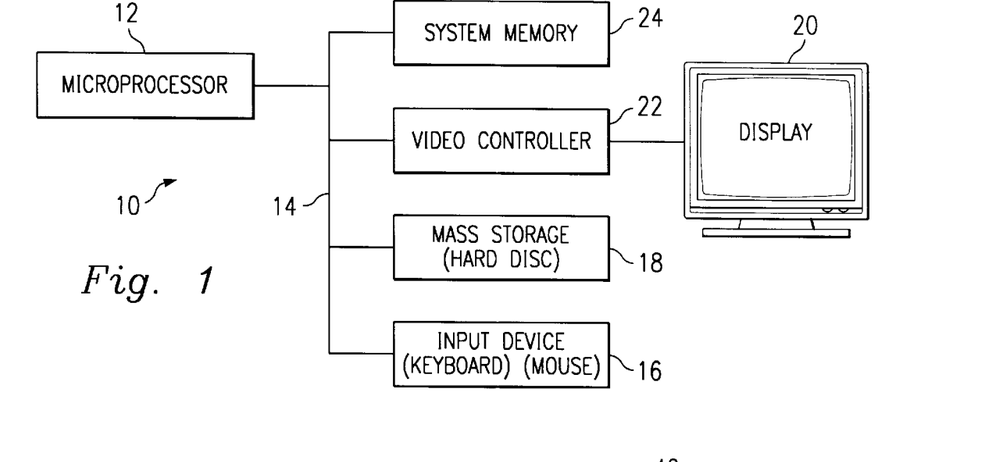
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 10 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
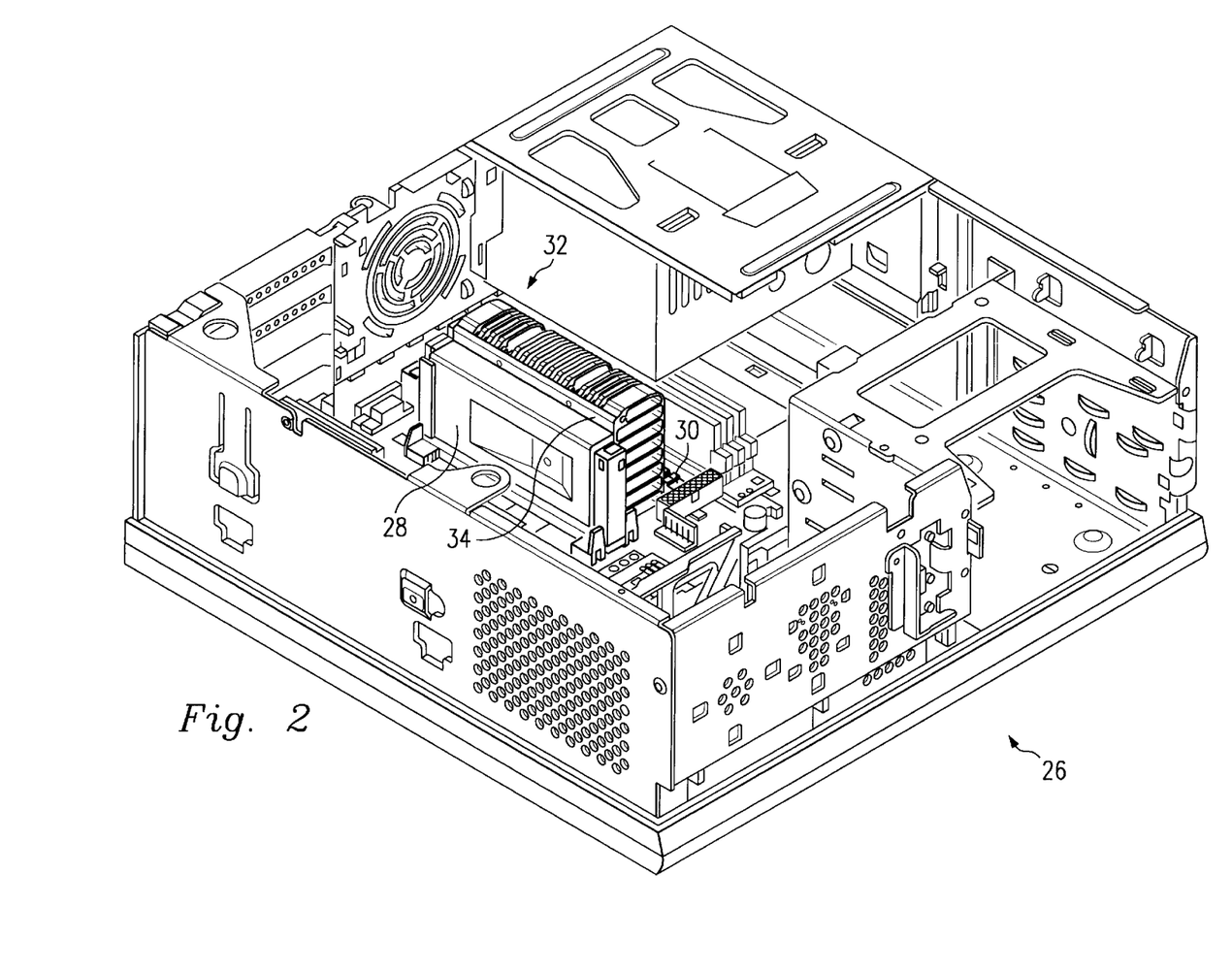
FIG. 2 is an isometric view illustrating an embodiment of a heat sink mounted in a computer chassis.

In FIG. 2, a chassis 26 of system 10 includes a processor module 28 and a circuit board 30 mounted therein. A heat sink 32 includes a thermal plate 34 mounted directly to processor module 28 for drawing heat therefrom. Heat sink 32 is mounted directly above circuit board 30 but may not contact board 30 or any of the components thereon (not shown) without possible resulting damage.

Figure 3:
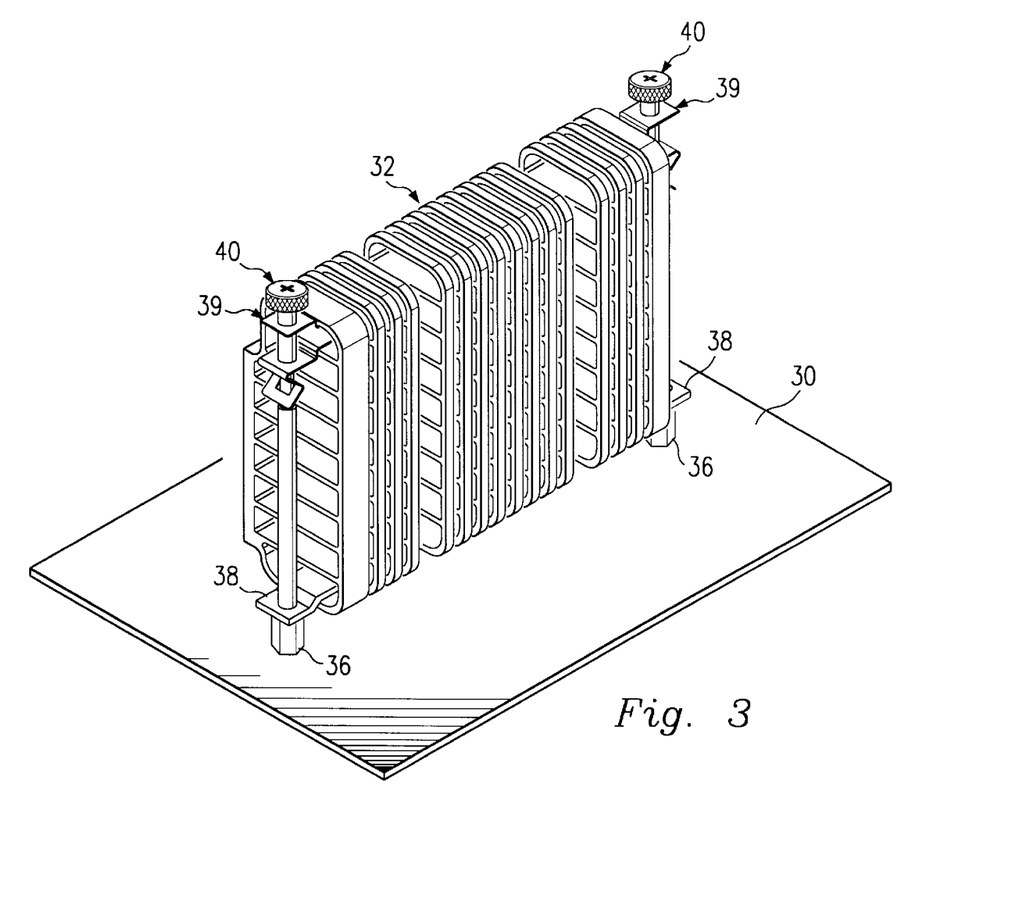
FIG. 3 is an isometric view illustrating an embodiment of a heat sink mounted on a motherboard.

In FIG. 3, heat sink 32, which is preferably formed of aluminum, is supported above circuit board 30 by a plurality of rigid support members such as standoffs 36 which are mounted on board 30 and extend upwardly therefrom. A pair of flanges 38 extend from heat sink 32 and receive standoffs 36. A pair of resilient retainers 39 are removably mounted on heat sink 32 and a fastener member 40 in the form of a long thumbscrew, is supported by each resilient retainer and is removably secured to standoffs 36.

Figure 4:
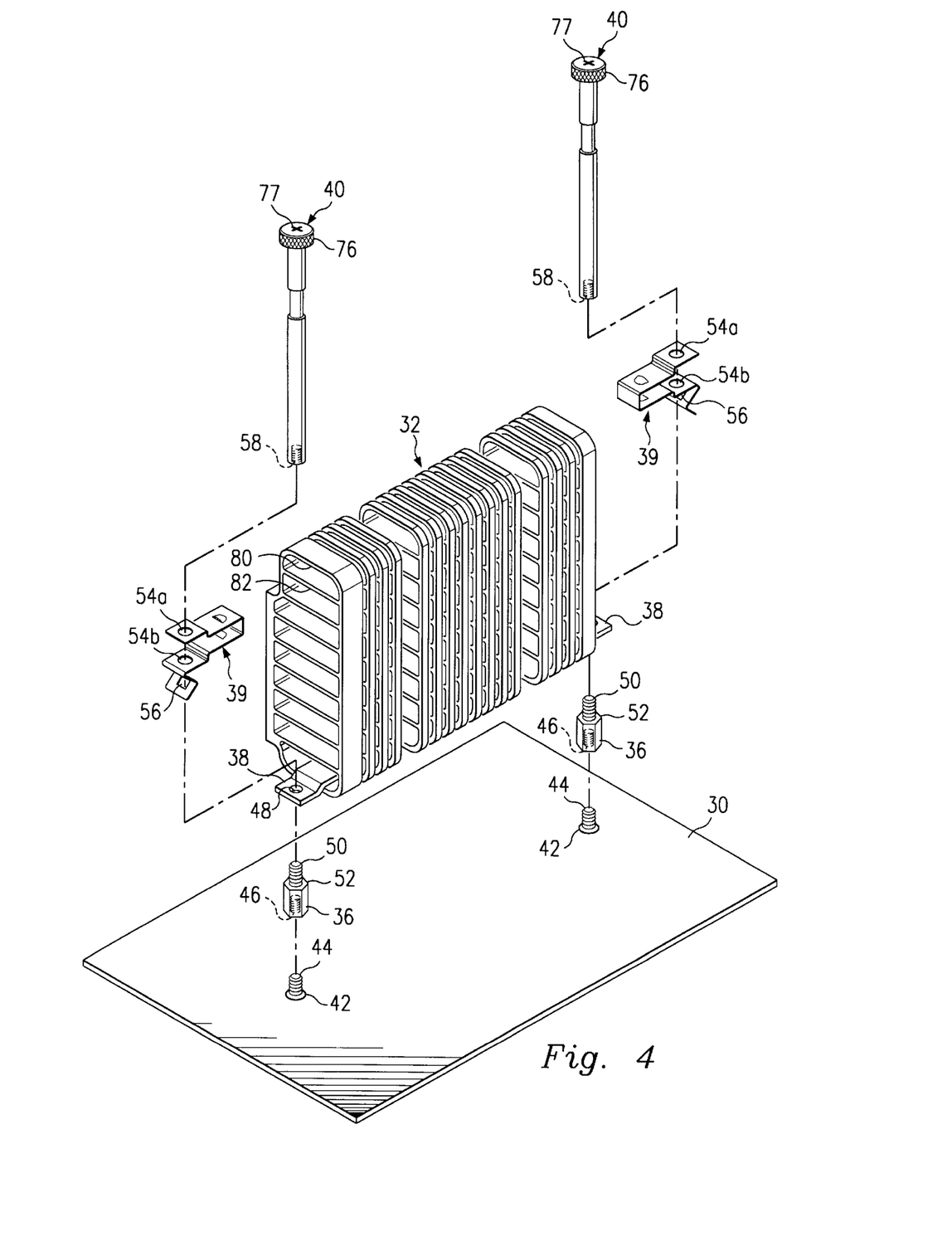
FIG. 4 is an exploded isometric view illustrating an embodiment of a heat sink mounting system.

Referring to FIG. 4, circuit board 30 includes a pair of openings 42 formed therein for receiving a pair of threaded studs 44 to extend therethrough. Standoffs 36 each include a threaded bore 46 for receiving threaded studs 44. In this manner, standoffs 36 are secured to board 30. Flanges 38 of heat sink 32 include an aperture 48 formed therethrough for receiving a threaded extension 50 of each standoff 36. In this manner, the threaded extensions 50 extend through apertures 48 so that flanges 38 each rest on a shoulder 52 of standoffs 36. Resilient retainers 39 snap into captive engagement with heat sink 32 and each fastener member 40 extends through a pair of fastener guide members 54a, 54b, formed in each fastener member 40. Each fastener member 40 also extends through a fastener retention member 56 also aligned with fastener guide members 54a, 54b. A threaded bore 58 formed in each fastener member 40 receives threaded extensions 50 of each standoff 36 thus securing heat sink 32 to board 30.

Figures 5, 6:
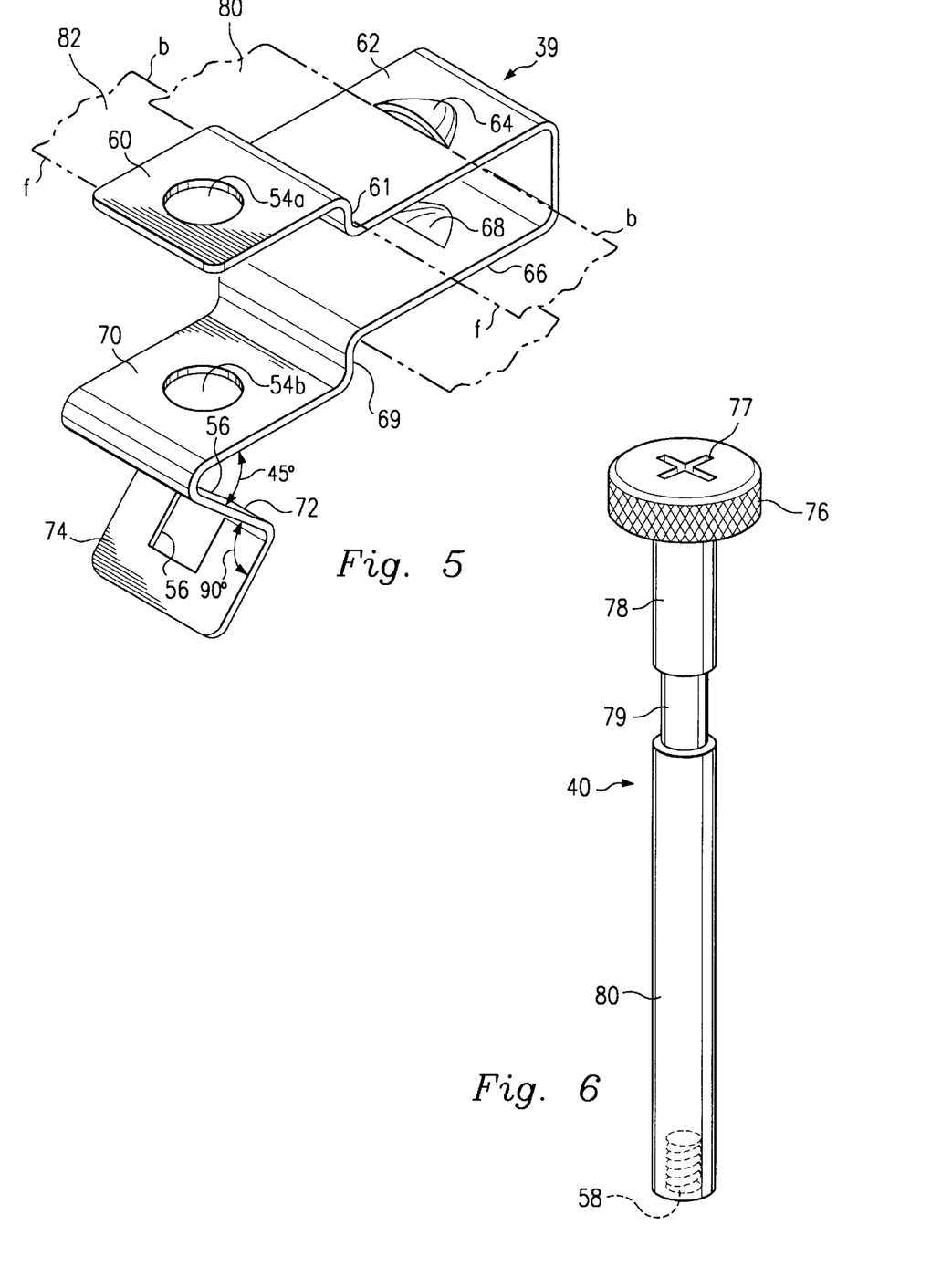
FIG. 5 is an isometric view illustrating an embodiment of a resilient retainer.
FIG. 6 is an isometric view illustrating an embodiment of a fastener.

Each resilient retainer member 39, FIG. 5 is formed of a continuous strip of spring steel material. A first section 60 of retainer 39 includes a first one of the guide members 54a. A second section 62 is defined from section 60 by a step 61. Section 62 includes a raised tab 64. Section 62 is folded and returns to form a section 66 which is substantially parallel to and is spaced apart from section 62 and includes another tab 68 which is raised from section 66 in a direction opposite the direction in which tab 64 is raised. Another step 69 defines section 66 from a section 70 which is spaced apart from and substantially parallel with section 60 and includes a second one of the guide members 54b aligned with first guide member 54a of section 60. A further section 72 is angularly disposed relative to section 70 at about a 45° angle and a terminal section 74 is angularly disposed relative to section 72 at about a 90° angle. Fastener retention member 56 is formed as a continuous slot extending into sections 72 and 74 in alignment with first and second aligned guide members 54a, 54b.

An enlarged view of fastener 40, FIG. 6 illustrates a knurled head 76 including a screwdriver receiving slot 77 and a first shaft portion 78. A reduced diameter shaft portion 79 extends between first shaft portion 78 and a second shaft portion 80 which includes the threaded aperture 58.

Figure 7:
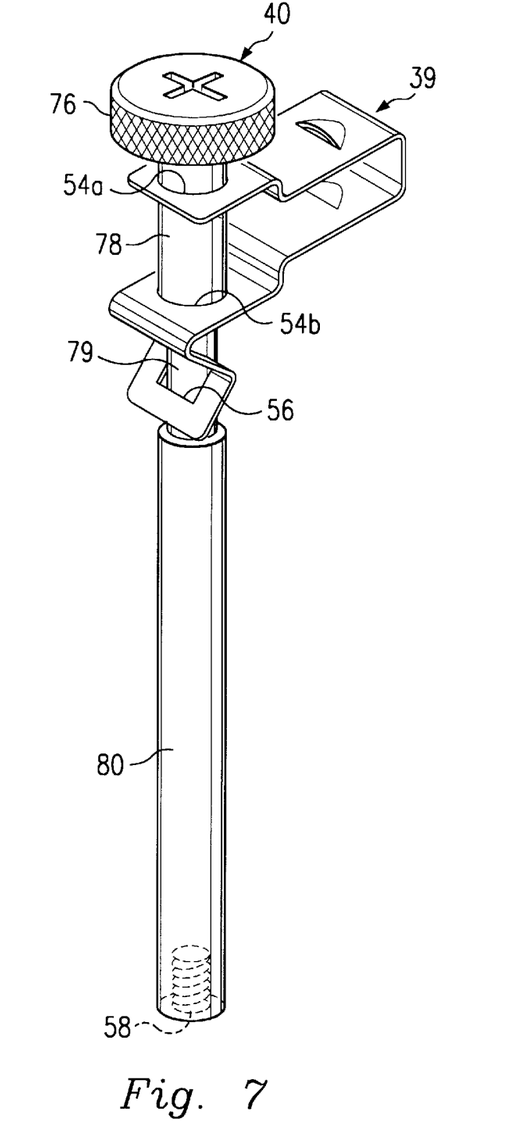
FIG. 7 is an isometric view illustrating an embodiment of the fastener mounted in the retainer.
Figure 8:
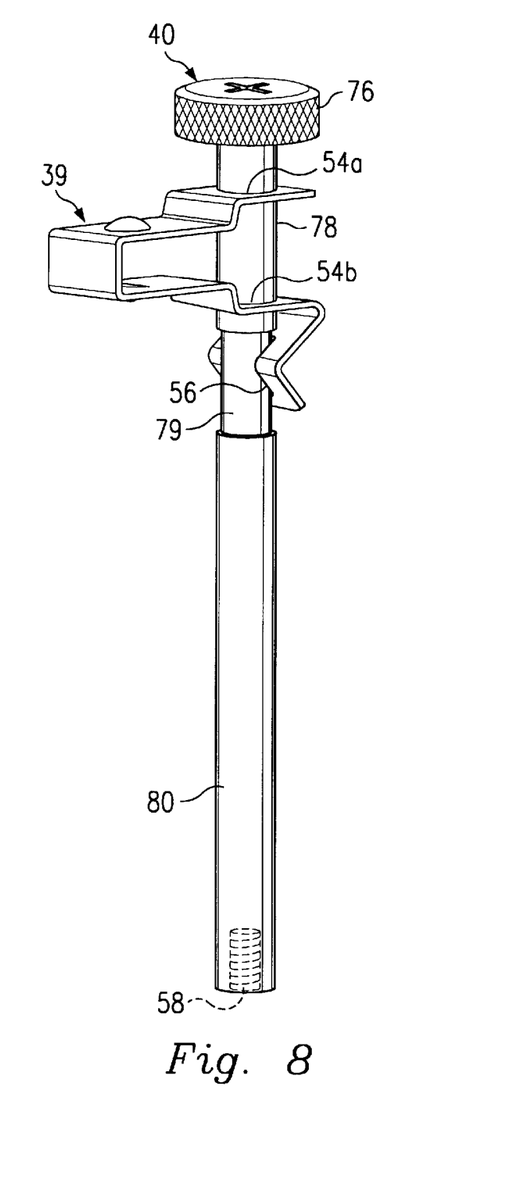
FIG. 8 is another isometric view illustrating an embodiment of the fastener mounted in the retainer.

It can be seen as illustrated in FIGS. 7 and 8 that fastener member 40 is engaged at first shaft portion 78 by both aligned guide members 54a, 54b, of resilient retainer 39. Reduced diameter shaft portion 79 is engaged by retention member 56. As stated above, threaded aperture 58 is provided to engage threaded extension 50 of each standoff 36. Fastener retention member 56 is of a size sufficiently large enough to loosely engage reduced diameter shaft portion 79 so as not to frictionally limit rotation of fastener member 40. However, fastener retention member 56 is of a size sufficiently small enough to limit vertical movement of first shaft portion 78 and second shaft portion 80. In this manner, fastener member 40 is captively engaged with resilient retainer 39, and vertical movement of fastener member 40 is limited to movement of reduced diameter shaft portion 79 in retention member 56.

Resilient retainers 39 are retained in heat sink 32 by inserting sections 62 and 66, FIG. 5, between a pair of spaced apart ribs 80, 82, see also FIG. 4, of heat sink 32. Raised tabs 64, 68, and steps 61, 69 respectively engage opposite edges b and f, of ribs 80, 82. Spacing between sections 62, 66 is sufficient to enable a snap-in fit between the retainer 39 and the heat sink 32. Removal of retainer 39 from between ribs 80, 82 is enabled by urging sections 60, 70 toward each other to disengage raised tabs 64, 68 from ribs 80, 82.

In operation, a heat sink supplier can install inserts 39, FIG. 4, between ribs 80, 82 of heat sink 32. Fastener members 40 are inserted through aligned guide members 54a, 54b, until reduced diameter portion 79 is engaged by fastener retention member 56. In this manner, fastener members 40 are positioned to mount heat sink 32 on circuit board 30 when flanges 38 are seated on shoulders 52 of standoffs 36, whereby threaded extensions 50 extend through apertures 48 and are threadably engaged by threaded bores 58 of fastener members 40. The fastener members 40 are of sufficient length to engage standoffs 36 and permit manual access to knurled head 76 for permitting thumbscrew action to be imposed on fastener members 40. Screwdriver slot 77 provides for further adjustment to fastener members 40.

As it can be seen, the principal advantages of these embodiments are that the resilient retainer is captive to the heat sink, the fastener member is captive to the retainer and is positioned in an aligned retention for facilitated manual or tool access for installing the heat sink on the standoffs. In this manner, the heat sink may be easily installed or removed and the fastener cannot inadvertently be dropped into the chassis where possible damage to electronic components may result.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiment disclosed therein.

What is claimed is:

1. A heat sink support system comprising:
   a chassis;
   a support member mounted on the chassis;
   a heat sink mounted on the support member;
   a resilient retainer removably mounted on the heat sink;
   a fastener member supported by the resilient retainer and removably secured to the support member;
   the resilient retainer including a pair of aligned, spaced apart fastener guide members and a fastener retention member aligned with the fastener guide members and spaced apart therefrom;
   a pair of spaced apart raised tabs, each of the tabs being adjacent a respective one of the fastener guide members;
   the fastener guide members each including an opening of a first size, and the fastener retention member including an opening of a second size, less than the first size; and the fastener member including a first shaft portion and a second shaft portion each having a first diameter, the first shaft portion being engaged with the fastener guide member openings, and including a reduced diameter shaft portion of a second diameter, less than the first diameter, engaged with the retention member opening, for captively engaging and limiting movement of the fastener member relative to the resilient retainer.

2. The system as defined in claim 1 wherein the resilient retainer is formed of a continuous strip of resilient material.

3. The system as defined in claim 2 wherein the raised tabs extend in opposite directions.

4. The system as defined in claim 3 wherein the fastener retention member includes a slot for limiting vertical movement of the fastener member and permitting rotational movement of the fastener member.

5. The system as defined in claim 1 wherein the raised tabs provide snap-in engagement with the heat sink.

6. A computer system comprising:
   a microprocessor;
   an input coupled to provide input to the microprocessor;
   a mass storage coupled to the microprocessor;
   a display coupled to the microprocessor by a video controller;
   a memory coupled to provide storage to facilitate execution of computer programs by the microprocessor;
   a chassis;
   a support member mounted on the chassis;
   a heat sink mounted on the support member;
   a resilient retainer removably mounted on the heat sink;
   a fastener member supported by the resilient retainer and removably secured to the support member;
   the resilient retainer including a pair of aligned, spaced apart fastener guide members and a fastener retention member aligned with the fastener guide members and spaced apart therefrom;
   a pair of spaced apart raised tabs, each of the tabs being adjacent a respective one of the fastener guide members;
   the fastener guide members each including an opening of a first size, and the fastener retention member including an opening of a second size, less than the first size; and
   the fastener member including a first shaft portion and a second shaft portion each having a first diameter, the first shaft portion being engaged with the fastener guide member openings, and including a reduced diameter shaft portion of a second diameter, less than the first diameter, engaged with the retention member opening, for captively engaging and limiting movement of the fastener member relative to the resilient retainer.

7. The system as defined in claim 6 wherein the resilient retainer is formed of a continuous strip of resilient material.

8. The system as defined in claim 7 wherein the raised tabs extend in opposite directions.

9. The system as defined in claim 8 wherein the fastener retention member includes a slot.

10. The system as defined in claim 6 wherein the raised tabs provide snap-in engagement with the heat sink.

11. A retainer assembly for supporting a fastener on a heat sink comprising:
    a retainer including a continuous strip of resilient material having a pair of aligned, spaced apart fastener guide members and a fastener retention member aligned with the fastener guide members and spaced apart therefrom;
    the fastener guide members being a first circular guide member and a second circular guide member, the first and second guide members being of a first size;
    the fastener retention member being a slot of a second size less than the first size;
    a pair of spaced apart raised tabs respectively adjacent the guide members and provided to snap into engagement with the heat sink; and
    a fastener member supported by the retainer, the fastener member including a first shaft portion and a second shaft portion each having first diameter, the first shaft portion being engaged with the fastener guide member openings, and including a reduced diameter shaft portion of a second diameter, less than the first diameter, engaged with the retention member opening, for captively engaging and limiting movement of the fastener member relative to the resilient retainer.

12. The retainer as defined in claim 11 further comprising a fastener member supported by the retainer, the fastener member having a first portion of a first diameter engaged with the first and second guide members and having a second portion of a second diameter less than the first diameter engaged with the fastener retention member.

13. A system for mounting a heat sink in a computer chassis comprising:
    a heat sink;
    a resilient retainer removably mounted on the heat sink;
    the retainer including a continuous strip of resilient material including a pair of aligned, spaced apart fastener guide members and a fastener retention member aligned with the fastener guide members and spaced apart therefrom;
    the fastener guide members being of a first size;
    the fastener retention member being of a second size less than the first size;
    a pair of spaced apart raised tabs respectively adjacent the guide members and provided to snap into engagement with the heat sink; and
    a fastener member supported by the resilient retainer and having a first and a second shaft portion of a first diameter, the first shaft portion being engaged with the first and second guide members, and having a reduced shaft portion of a second diameter less than the first diameter engaged with the fastener retention member for captively engaging and limiting movement of the fastener member relative to the resilient retainer.

14. The system as defined in claim 13 wherein the fastener guide members include first and second parallel sections of the retainer having apertures formed therethrough.

15. The system as defined in claim 13 wherein the fastener retention member includes angularly disposed sections of the retainer having a continuous slot formed therein.

16. The system as defined in claim 13 wherein the raised tabs are formed on opposite sections of the retainer.

17. The system as defined in claim 13 wherein the fastener member is an elongated thumbscrew including a knurled head.

18. The system as defined in claim 17 wherein the knurled head includes a tool receiving slot formed therein.

19. The system as defined in claim 13 wherein the fastener member includes a first shaft section and a second shaft section of the first diameter, the second portion of the fastener member being between the first and the second section.

20. A method of retaining a heat sink in a computer chassis comprising the steps of:

mounting a standoff member in the chassis;

mounting a heat sink on the standoff member;

captively mounting a resilient snap-in clip on the heat sink by means of a pair of oppositely extending raised tabs;

captively supporting a fastener member in the resilient clip by means of a pair of aligned, spaced apart circular fastener guide members and a slotted fastener retention member aligned with the fastener guide members and spaced apart therefrom;

positioning the heat sink in the chassis to receive the standoff member;

engaging an end of the fastener member with the standoff member;

engaging a first diameter shaft portion with the fastener guide members; and engaging a second diameter shaft portion, less than the first diameter shaft portion with the retention member, for captively engaging and limiting movement of the fastener member relative to the resilient clip.

* * * * *

UNITED STATES PATENT AND TRADEMARK OFFICE
CERTIFICATE OF CORRECTION

PATENT NO.     : 5,999,402
DATED          : December 7, 1999
INVENTOR(S)    : John Jeffries, Erica Scholder and Gilberto Hernandez It is certified that error appears in the above-identified patent and that said Letters Patent is hereby corrected as shown below:

Column 6,
Lines 19-24, please delete claim 12.
Lines 25-62, please renumber claims 13-18 to claims 12-17.
Lines 63-67, please delete claim 19.

Columns 7 and 8,
Please renumber claim 20 to claim 18.

Signed and Sealed this

Twelfth Day of November, 2002

Attest:

JAMES E. ROGAN
Attesting Officer      Director of the United States Patent and Trademark Office